US012787785B2

(12) United States Patent
Lin et al.

(10) Patent No.: US 12,787,785 B2
(45) Date of Patent: Nov. 3, 2026

(54) SEMICONDUCTOR DEVICE AND METHOD OF MAKING THE SAME AND SEAL RING STRUCTURE

(71) Applicant: HUNAN SAN'AN SEMICONDUCTOR CO., LTD., Changsha (CN)

(72) Inventors: Kechuang Lin, Changsha (CN); Ning Xu, Changsha (CN); Cheng Liu, Changsha (CN); Nien-Tze Yeh, Changsha (CN)

(73) Assignee: HUNAN SAN'AN SEMICONDUCTOR CO., LTD., Changsha (CN)

( * ) Notice: Subject to any disclaimer, the term of this patent is extended or adjusted under 35 U.S.C. 154(b) by 535 days.

(21) Appl. No.: 18/342,560

(22) Filed: Jun. 27, 2023

(65) Prior Publication Data

US 2023/0361056 A1 Nov. 9, 2023

Related U.S. Application Data

(63) Continuation-in-part of application No. PCT/CN2021/112134, filed on Aug. 11, 2021.

(30) Foreign Application Priority Data

Dec. 28, 2020 (CN) ........................ 202011581439.X

(51) Int. Cl.
*H10W 42/00* (2026.01)
*H10D 8/00* (2025.01)
(Continued)

(52) U.S. Cl.
CPC .............. *H10W 42/00* (2026.01); *H10D 8/00* (2025.01); *H10D 30/015* (2025.01);
(Continued)

(58) Field of Classification Search
CPC .... H10D 89/91; H10D 89/811; H10D 89/911; H10D 89/60; H10D 30/475; H10D 1/43;
(Continued)

(56) References Cited

U.S. PATENT DOCUMENTS 5,998,245 A * 12/1999 Yu ........................ H10D 89/611
438/10
2018/0012770 A1* 1/2018 Macelwee ........... C01B 21/0632
(Continued)

FOREIGN PATENT DOCUMENTS

CN 103219720 A 7/2013
CN 107731742 A 2/2018

OTHER PUBLICATIONS

Search Report issued to PCT application No. PCT/CN2021/112134 on Nov. 17, 2021.

*Primary Examiner* — Moazzam Hossain
(74) *Attorney, Agent, or Firm* — MUNCY, GEISSLER, OLDS & LOWE, P.C.

(57) ABSTRACT

A semiconductor device includes a substrate and a semiconductor structure that is located on the substrate and that includes a device portion including a semiconductor element, and a seal ring portion. The semiconductor element includes a first electrode and a second electrode. The seal ring portion surrounds the device portion and includes a conducting element. The conducting element includes an enhanced-High-Electron-Mobility-Transistor (eHEMT) that includes a first gate electrode electrically connected to the first electrode, a first source electrode electrically connected to the second electrode, and a first drain electrode electrically connect to the first electrode. A method for making the semiconductor device and a seal ring structure are also provided.

20 Claims, 9 Drawing Sheets

(51) Int. Cl.
*H10D 30/01* (2025.01)
*H10D 30/47* (2025.01)
*H10D 89/60* (2025.01)

(52) U.S. Cl.
CPC ......... *H10D 30/475* (2025.01); *H10D 89/811* (2025.01); *H10D 89/911* (2025.01)

(58) Field of Classification Search
CPC ...... H10D 8/60; H10D 62/343; H10D 62/824; H10D 62/8503; H10D 8/00; H10D 30/015; H10D 89/601; H10W 42/00; H10W 42/60; H10W 42/121
See application file for complete search history.

(56) References Cited

U.S. PATENT DOCUMENTS

2019/0371785 A1* 12/2019 Liu ........................ H10D 89/60
2020/0066660 A1* 2/2020 Altunkilic ........... H10W 42/121
2024/0014308 A1* 1/2024 Yang .................... H10D 30/475

* cited by examiner

SEMICONDUCTOR DEVICE AND METHOD OF MAKING THE SAME AND SEAL RING STRUCTURE

CROSS-REFERENCE TO RELATED APPLICATION

This application is a bypass continuation-in-part (CIP) of International Application No. PCT/CN2021/112134, filed on Aug. 11, 2021, which claims priority of Chinese Patent Application No. 202011581439.X, filed on Dec. 28, 2020. The entire content of each of the international and Chinese patent applications is incorporated herein by reference.

FIELD

The disclosure relates to a semiconductor device, a seal ring structure and a method of making the semiconductor device.

BACKGROUND

Electro-static discharge (ESD) is a sudden and momentary flow of electric current and may occur between an integrated circuit (IC) chip and an external object. Because a large electric charge may be discharging over a very short period, energy generated by the ESD may be too much for the IC chip to handle which may temporarily or permanently damage the circuitry of the IC. Therefore, in order to prevent damage to the IC chip, ESD protection becomes an important design consideration that may impact product reliability and yield.

Conventionally, IC chips are designed with an independent anti-ESD component or structure so that the IC is protected from ESD. However, the independent anti-ESD component or structure will take up space on the IC chip and cause the IC chip to be larger which is unsuitable for miniaturization of the IC chip.

Conventionally, dicing channels are created between chips on a wafer, and then the wafer is diced to create separate chips. However, during the dicing of the wafer, stress and impurities (e.g., debris generated during dicing) may be created which may damage the chips. Conventionally, die seal ring structures (also referred to as chip seal rings or seal rings) are disposed between the dicing channels and the chips and surround the chips so as to protect the chips during dicing. The die seal ring structures are an important component of semiconductor fabrication. However, conventional die seal ring structures only have the function of offering physical protection, and does not have the function of ESD protection. The ESD protection is handled by a separate and independent ESD component/structure which takes up space in the chip.

SUMMARY

Therefore, an object of the disclosure is to provide a semiconductor device and a method for making the semiconductor device as well as a seal ring structure that can alleviate at least one of the drawbacks of the prior art.

According to the disclosure, the semiconductor device includes a substrate, and a semiconductor structure located on the substrate and including a device portion and a seal ring portion. The device portion includes a semiconductor element that includes a first electrode, and a second electrode. The seal ring portion surrounds the device portion and includes a conducting element. The conducting element includes an enhanced-High-Electron-Mobility-Transistor (eHEMT) that includes a first gate electrode electrically connected to the first electrode, a first source electrode electrically connected to the second electrode, and a first drain electrode electrically connected to the first electrode.

According to another aspect of the disclosure, the method for making a semiconductor device includes: providing a substrate; forming an epitaxial unit on a surface of the substrate that includes a device area, and a seal ring area surrounding the device area; forming a semiconductor element in the device area that includes a first electrode, and a second electrode; forming an enhanced-High-Electron-Mobility-Transistor (eHEMT) in the seal ring area that includes a first gate electrode, a first source electrode, and a first drain electrode, the first gate and first drain electrode being electrically connected to the first electrode of the semiconductor element, and the first source electrode being electrically connected to the second electrode of the semiconductor element.

Another aspect of the disclosure is a seal ring structure that is adapted to surround a device portion that includes a semiconductor element including a first electrode and a second electrode. The seal ring structure includes a substrate, and a semiconductor structure. The semiconductor structure is located on the substrate, and includes a seal ring portion adapted for surrounding the device portion. The seal ring portion includes a conducting element formed in the seal ring portion The conducting element includes an enhanced-High-Electron-Mobility-Transistor (eHEMT) that includes a first gate electrode, a first source electrode, and a first drain electrode. The first gate electrode is adapted for electrical connection to the first electrode of the semiconductor element. The first source electrode is adapted for electrical connection to the second electrode of the semiconductor element. The first drain electrode is adapted for electrical connection to the first electrode of the semiconductor element.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
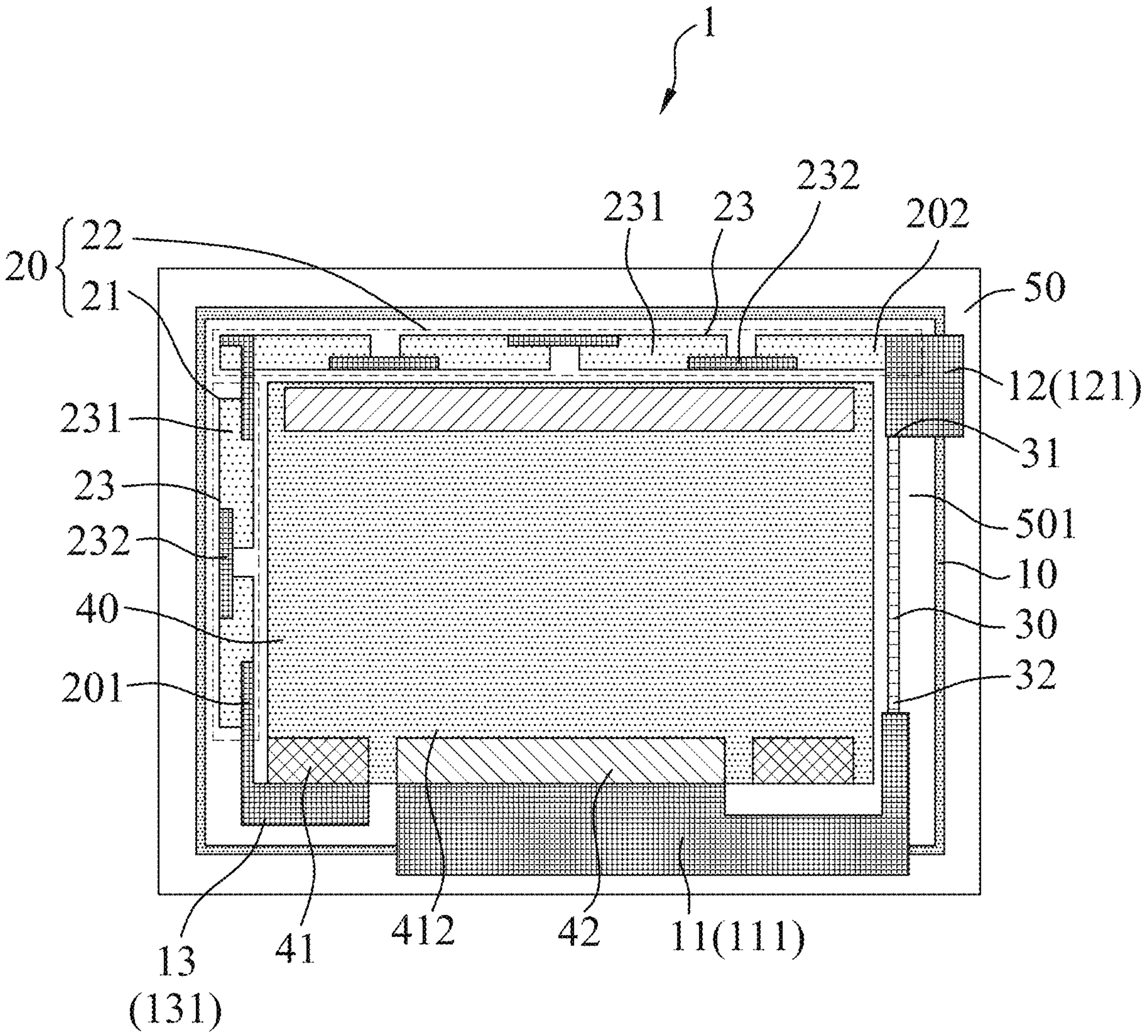
FIG. 1 is a schematic top view illustrating an embodiment of a semiconductor device according to the present disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "left," ""right," on," "above," "over," "downwardly," "upwardly," "vertical," "horizontal" and the like may be used throughout the disclosure while making reference to the features as illustrated in the drawings. The features may be oriented differently (e.g., rotated 90 degrees or at other orientations) and the spatially relative terms used herein may be interpreted accordingly. Furthermore, the terms "first," "second," and other ordinal numbers used in connection with technical features are solely for descriptive purposes, and should not be understood as indicating or implying relative importance of the technical features or implying the quantity of the technical features.

Furthermore, when the terms "horizontal," "vertical" or other similar terms are employed to describe a component, the intended message is not that the component must be absolutely level or upright, and the component may be at a slight angle. For example, a "horizontal" component only means that the component's direction is more horizontal rather than "vertical." Additionally, a "horizontal" structure does not mean that the structure must be completely horizontal, but may be slightly inclined.

In the description of the present disclosure, it should also be noted that, unless otherwise specified or explicitly stated, the terms "disposed," "installed," "mounted," "connected," "coupled" and the like should be understood in a broad sense. For example, a "connection" may be a fixed connection, but it may also be a detachable connection or an integral connection; it may be a mechanical connection or an electrical connection; it may be a direct connection or an indirect connection achieved through an intermediary, or it may refer to the internal communication of two components. The above terms as used in the present disclosure are intended to be understandable to one of ordinary skill in the art under the specific situations as described in the disclosure.

Figure 2:
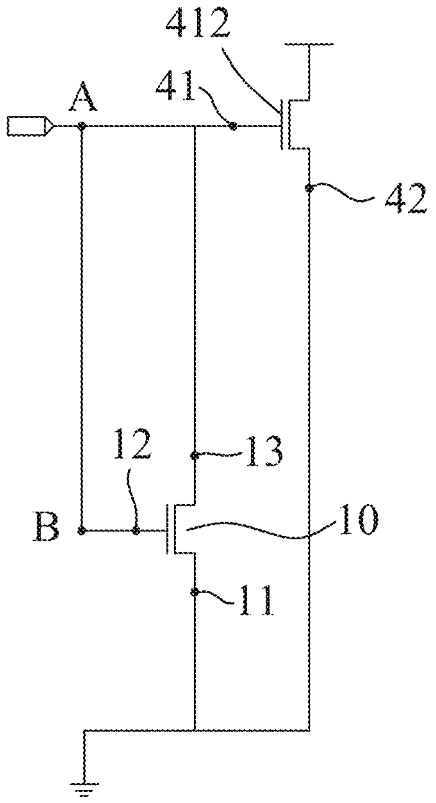
FIG. 2 is a circuit diagram illustrating an equivalent circuit of the embodiment.
Figure 6:
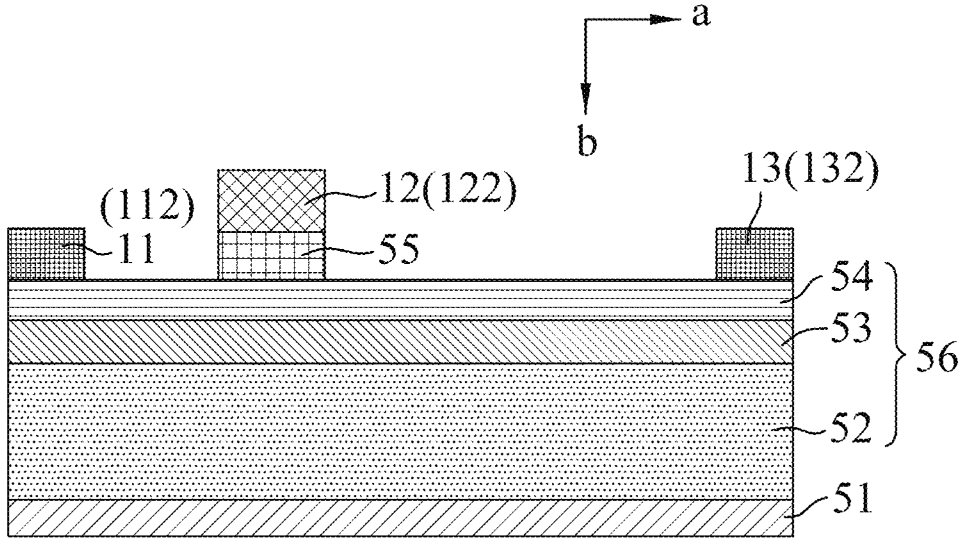
FIG. 6 is a schematic cross-sectional view illustrating a single cell of an enhanced-High-Electron-Mobility-Transistor (eHEMT) of the embodiment.

Referring to FIGS. 1, 2, and 6, an embodiment of a semiconductor device 1 according to the present disclosure includes a substrate 51, and a semiconductor structure. The semiconductor structure is located on the substrate 51, and includes a device portion 40 and a seal ring portion 50. The device portion 40 is formed with a semiconductor element 412 including a first electrode 41 and a second electrode 42. The seal ring portion 50 surrounds a periphery of the device portion 40 and is formed with a conducting element including an enhanced-High-Electron-Mobility-Transistor (eHEMT) 10. The eHEMT 10 includes a first gate electrode 12 electrically connected to the first electrode 41 of the semiconductor element 412, a first source electrode 11 electrically connected to the second electrode 42 of the semiconductor element 412, and a first drain electrode 13 electrically connected to the first electrode 41 of the semiconductor element 412.

In some embodiments, the eHEMT 10 has multiple cells, and a single cell of the eHEMT 10 is shown in FIG. 6. It should be noted that the first source electrode 11 includes a first pad portion 111, and a first electrode portion 112. The first gate electrode 12 includes a second pad portion 121, and a second electrode portion 122. The first drain electrode 13 includes a third pad portion 131, and a third electrode portion 132. FIG. 1 respectively shows the first pad portion 111, the second pad portion 121, and the third pad portion 131 of the first source electrode 11, the first gate electrode 12, and the first drain electrode 13 from a schematic top view, and FIG. 6 respectively shows the first electrode portion 112, the second electrode portion 122, and the third electrode portion 132 of the first source electrode 11, the first gate electrode 12, and the first drain electrode 13 in a schematic cross-sectional view. The semiconductor structure may include an epitaxial unit 56 that includes a buffer layer 52, a channel layer 53, a barrier layer 54, and a P-type nitride layer 55 that are sequentially stacked on the substrate 51 (see FIG. 6).

In some embodiments, the eHEMT 10 surrounds the periphery of the device portion 40, and the first gate electrode 12, the first source electrode 11, and the first drain electrode 13 are disposed on the epitaxial unit 56. In some embodiments, the eHEMT 10 forms an enclosed ring around the device portion 40 which seals and protects the device portion 40 on all sides, and provides superior physical and electrostatic discharge (ESD) protection for the device portion 40.

Referring to FIGS. 1, and 2, because the first gate electrode 12 and the first drain electrode 13 of the eHEMT 10 are both electrically connected to the first electrode 41 of the semiconductor element 412, and the first source electrode 11 is electrically connected to the second electrode 42 of the semiconductor element 412, positive electric charge from the first electrode 41 of the semiconductor element 412 will accumulate at a point (A) until a threshold voltage of the eHEMT 10 is surpassed, and a conducting path is created for the accumulated positive charge to discharge from the point (A). The threshold voltage in this case may range from 1V to 2V. This helps to discharge excess charge from the first electrode 41 of the semiconductor element 412, and improve ESD protection of the semiconductor device 1. On the other hand, when negative electric charge from the first electrode 41 accumulates at the point (A), thereby creating a negative potential relative to the second electrode 42, because of the enhanced high electron mobility and reverse conduction properties of the eHEMT 10, the negative charge at the point (A) may be discharged via a reverse conduction path, and electro-static buildup in the semiconductor device 1 may be discharged.

In some embodiments, the first gate electrode 12 of the eHEMT 10 and the first electrode 41 of the semiconductor element 412 are electrically connected via a metal connection, the first source electrode 11 and the second electrode 42 are electrically connected via a metal connection, and the first drain electrode 13 and the first electrode 41 are electrically connected via a metal connection.

In this embodiment, the seal ring portion 50 formed with the conducting element that includes the eHEMT 10 not only physically protects the device portion 40, but also provides ESD protection to the device portion 40, and allows the semiconductor device 1 to dispense with installing a separate anti-ESD structure which saves space.

Referring to FIGS. 1, 3, 6, and 7, in some embodiments the conducting element (Y) further includes a plurality of diodes 23 that form a diode assembly 20 electrically connected to the first electrode 41 of the semiconductor element 412 and the gate electrode 12 of the eHEMT 10. The diode assembly 20 includes a diode assembly anode 201 and a diode assembly cathode 202. The diode assembly anode 201 is electrically connected to the first electrode 41 of the semiconductor element 412, and the diode assembly cathode 202 is electrically connected to the first gate electrode 12 of the eHEMT 10.

In some embodiments, at least two of the diodes 23 of the diode assembly 20 are electrically connected in series. It should be understood that the diode assembly may include multiple diodes 23 connected in series, and the amount of diodes 23 should be designed according to the intended purpose of the semiconductor device 1. In some embodiments, the diode assembly 20 includes 3 to 7 diodes 23 connected in series. For example, the diode assembly 20 may include 5 diodes 23 connected in series, or, the diode assembly 20 may include 6 diodes 23 connected in series.

Figure 3:
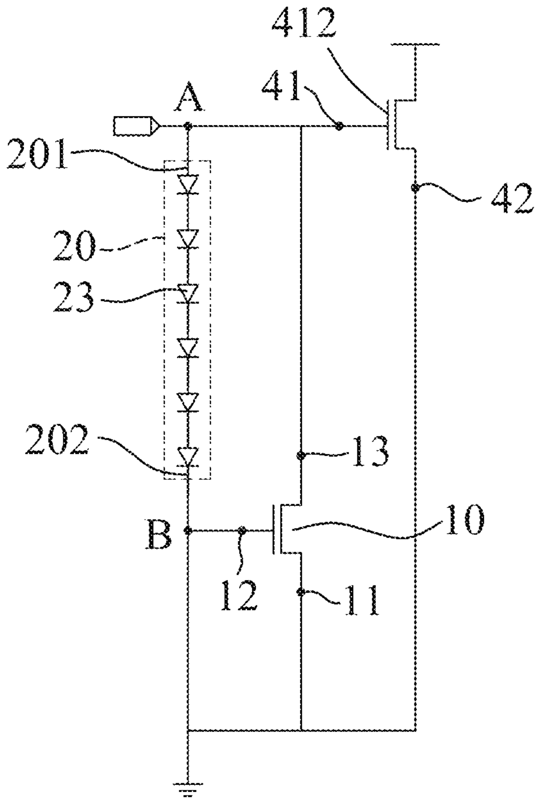
FIG. 3 is a circuit diagram showing another equivalent circuit of the embodiment.

Referring to FIGS. 1 and 3, the diode assembly anode 201 is electrically connected to the first electrode 41 of the semiconductor element 412, and the diode assembly cathode 202 is electrically connected to the first gate electrode 12 of the eHEMT 10. Additionally, the first drain electrode 13 of the eHEMT 10 is connected to the first electrode 41 of the semiconductor element 412, and the first source electrode 11 of the eHEMT 10 is connected to the second electrode 42 of the semiconductor element 412. When positive electric charge from the first electrode 41 accumulates at the point (A) and creates a positive potential relative to the second electrode 42, for example a positive potential of 6 V, the diode assembly 20 opens, and the positive electric charge flows through the diode assembly 20 to the ground so that the charge is dissipated. Additionally, when the charge flows through the diode assembly 20, a positive potential is generated at a point (B) which causes a conduction path to open in the eHEMT 10 upon the positive potential surpassing a threshold voltage, for example, a threshold voltage of 1V to 2V, and the positive charge accumulated at the point (A) will be conducted away and electro-static buildup will be dissipated. When negative charge from the first electrode 41 of the semiconductor element 412 accumulates at the point (A) and creates a negative potential relative to the second electrode. 42, because of the reverse conduction properties of the eHEMT 10, the negative charge may be discharged via a reverse conduction path, and electro-static buildup in the semiconductor device 1 may be discharged.

In some embodiments, the diode assembly anode 201 is electrically connected to the first electrode 41 via a metal connection, and the diode assembly cathode 202 is connected to the second electrode 42 via a metal connection. In some embodiments, the diode assembly anode 201 is formed via a metal connection between the first gate electrode 12 and the first source electrode 11 of an eHEMT.

In this embodiment, by virtue of the conducting element including the diode assembly 20, the seal ring portion 50 may physically protect the device portion 40, and provide ESD protection for the device portion 40, and thereby allow the semiconductor device 1 according the present disclosure to forgo having a separate anti-ESD structure and save space.

Referring to FIGS. 1, 4, 6, 7, and 8, in some embodiments the conducting element further includes a resistor 30. The resistor 30 is electrically connected between the diode assembly cathode 202 and the second electrode 42 of the semiconductor element 412. The resistor 30 includes a first metal end 31 connected to the diode assembly cathode 202, and a second metal end 32 connected to the second electrode 42.

In some embodiments, the diode assembly 20 and the resistor 30 are disposed along the periphery of the device portion 40. This decreases the effects of dicing on the device portion 40.

In some embodiments, each of the diode assembly 20 and the resistor 30 are disposed between the eHEMT 10 and the semiconductor element 412.

In order to make the seal ring portion 50 better protect the device portion 40, in some embodiments, each of the diodes 23 of the diode assembly 20 are positioned to be a first distance away from a peripheral edge of the device portion 40.

In some embodiments, the first distances between the diodes 23 of the diode assembly 20 and the peripheral edge of the device portion 40 are equal. In certain embodiments, the first distances may be 10 μm.

In some embodiments, the resistor 30 is a second distance away from the peripheral edge of the device portion 40, and the second distance is equal to the first distance. In certain embodiments, the first and second distances may be 10 μm.

In some embodiments, the diodes 23 of the diode assembly 20 and the resistor 30 may be sequentially connected in series along the periphery of the device portion 40, and the first distance between each of the diodes 23 of the diode assembly 20 and a peripheral edge of the device portion 40 is equal to the second distance between the resistor 30 and the peripheral edge of the device portion 40. More specifically, as shown in FIG. 1, the resistor 30 and the diodes 23 are arranged around the periphery of the device portion 40, and protect the device portion 40 from all sides. Moreover, the resistor 30 and the diodes 23 may be evenly distributed around the periphery of the device portion 40 and partially enclose the device portion 40. However, it should be noted that the placement of the diodes 23 and the resistor 30 as described above is not a limitation of the disclosure. The diodes 23 and the resistor 30 may be evenly distributed around the periphery of the device portion 40, or randomly distributed around the outer periphery of the device portion 40 as necessity dictates.

By arranging the resistor 30 and the diodes 23 around the periphery of the device portion 40, the device portion 40 may be shielded from harmful effects when the semiconductor device 1 is diced. In order for the seal ring portion 50 to better protect the device portion 40, in some embodiments, the seal ring portion 50 may be spaced apart from the device portion 40 by a minimum distance. More specifically, there is a minimum edge-to-edge distance (D) between an inner peripheral edge of the seal ring portion 50 and the peripheral edge of the device portion 40. In some embodiments, the edge-to-edge distance (D) may be 10 μm.

In some embodiments, the diode assembly 20 is grouped into a first sub-assembly 21 located on a first side of the device portion 40, and a second sub-assembly 22 located on a second side of the device portion 40. Furthermore, the first side of the device portion 40 is adjacent to the second side of the device portion 40.

In some embodiments, the first sub-assembly 21 and the second sub-assembly 22 are electrically connected in series, and the first sub-assembly 21 includes the diode assembly anode 201 that is electrically connected to the first electrode 41, and the second sub-assembly 22 includes the diode assembly cathode 202 that is connected to the first metal end 31 of the resistor 30.

In some embodiments, the first sub-assembly 21 includes at least one diode 23, and the second sub-assembly 22 includes at least one diode 23.

In some embodiments, the device portion 40 is non-rectangular. In this case, the first side is still adjacent to the second side, and there are no additional limitations.

In some embodiments, the first sub-assembly 21 and the resistor 30 are located on opposite sides of the device portion 40.

In some embodiments, the device portion 40 is substantially rectangular and the first side is one of the length sides and the second side is one of the adjacent width sides. In some other embodiments, the first side may be one of the width sides and the second side may be one of the adjacent length sides.

Figure 4:
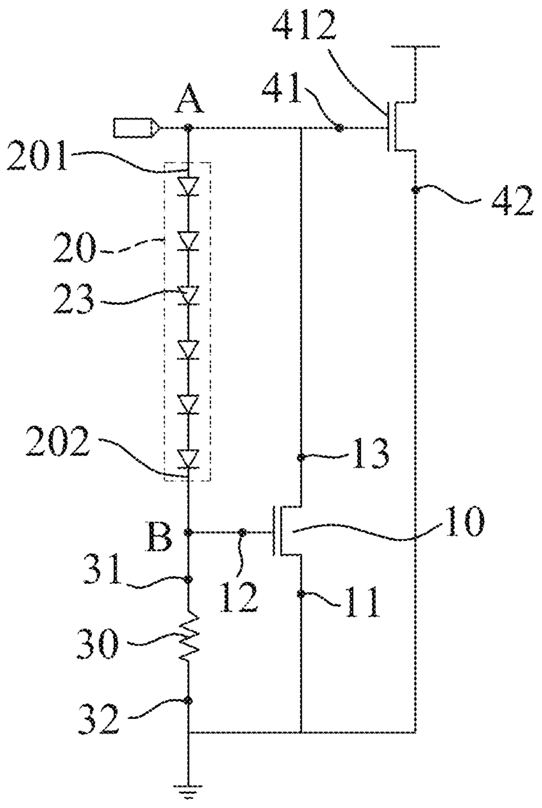
FIG. 4 is a circuit diagram showing yet another equivalent circuit of the embodiment.
Figure 5:
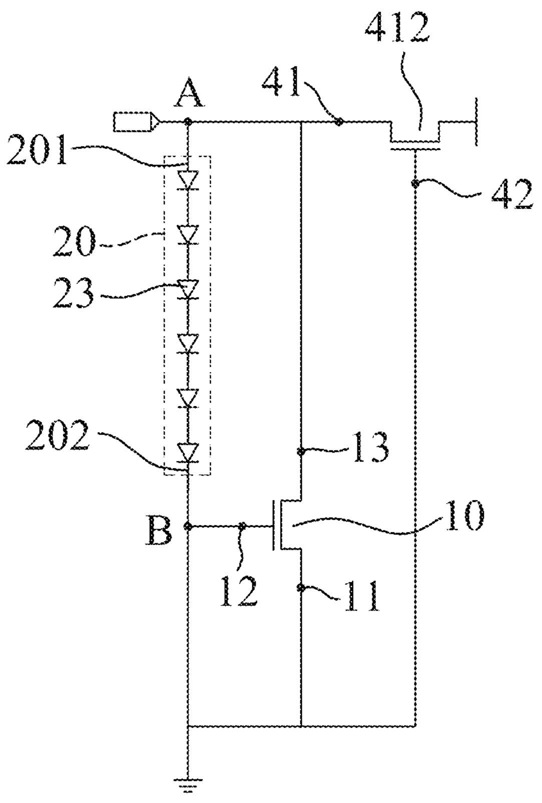
FIG. 5 is yet another a circuit diagram showing another equivalent circuit of the embodiment.

Referring to FIGS. 1 and 4, in this embodiment, the device portion 40 is substantially rectangular, the first sub-assembly 21 is located on a width side of the device portion 40 and is referred to as a longitudinal diode assembly, the second sub-assembly 22 is located on one of the adjacent length sides of the device portion 40 and is referred to as a transverse diode assembly, the longitudinal diode assembly and the transverse diode assembly are located on two adjacent sides of the device portion 40 and are electrically connected in series. The longitudinal diode assembly has the diode assembly anode 201 which is electrically connected to the first electrode 41 via a metal connection, and the transverse diode assembly has the diode assembly cathode 202 which is connected to the first metal end 31 of the resistor 30.

Referring to FIG. 1, the longitudinal diode assembly is shown as the diodes 23 connected in series on the left side of the device portion 40, and the transverse diode assembly is shown as the diodes 23 connected in series above the device portion 40. By arranging the longitudinal diode assembly and the transverse diode assembly on two adjacent sides of the device portion 40, the longitudinal diode assembly will be easier to electrically connect to the second diode sub-assembly 22, and better protection of the device portion 40 may be achieved. It should be noted that the placement and distribution of the diode assembly 20 are not limited by the examples given above, and in other embodiments, the diode assembly 20 may include only the longitudinal diode assembly or only include the transverse diode assembly.

Furthermore, the resistor 30 and the longitudinal diode assembly are located on two opposite sides of the device portion 40, the longitudinal diode assembly includes at least one diode 23, and the transverse diode assembly includes at least one diode 23. In this way, the longitudinal diode assembly, the transverse diode assembly, and the resistor 30 may be respectively distributed on three different sides of the device portion 40, and provide more protection to the device portion 40.

In the embodiment shown in FIG. 1, the longitudinal diode assembly includes two serially connected diodes 23, and the transverse diode assembly includes four serially connected diodes 23. The longitudinal diode assembly is located on the width side of the device portion 40, and the transverse diode assembly is located on the length side of the device portion 40. In this setup, the diodes 23 are relatively evenly distributed which provides more protection to the semiconductor element 412.

In another embodiment, the longitudinal diode assembly and the transverse diode assembly both include 3 serially connected diodes. In this case, adjacent sides of the device portion 40 are equal in length. For example, the device portion 40 may be square. However, this is not a limitation of the disclosure.

Referring to FIGS. 1 and 4, the diode assembly anode 201 is electrically connected to the first electrode 41 of the semiconductor element 412, the diode assembly cathode 202 is connected to the first metal end 31 of the resistor 30, and the second metal end 32 of the resistor 30 is connected to the second electrode 42 of the semiconductor element 412. The first gate electrode 12 of the eHEMT 10 is electrically connected to the diode assembly cathode 202, the first drain electrode 13 of the eHEMT 10 is electrically connected to the first electrode 41, and the first source electrode 11 of the eHEMT 10 is electrically connected to the second electrode 42 of the semiconductor element 412. With this connection setup, when positive charge from the first electrode 41 accumulates at the point (A) to create a positive potential, for example, a positive potential greater than 6 V, the diode assembly 20 will open, and the positive charge flows through the diode assembly 20 to be dissipated by the resistor 30. Additionally, when the charge flows through the diode assembly 20, a positive potential is generated at a point (B) which causes a conduction path to open in the eHEMT 10. Upon the positive potential surpassing a threshold voltage, for example, a threshold voltage of 1V to 2V, the positive charge accumulated at the point (A) will be conducted away and static buildup will be discharged. When negative charge from the first electrode 41 of the semiconductor element 412 accumulates at the point (A) and creates a negative potential relative to the second electrode. 42, because of the reverse conduction properties of the eHEMT 10, the negative charge may be discharged via a reverse conduction path, and electro-static buildup in the semiconductor device 1 may be discharged.

In some embodiments, the first metal end 31 is electrically connected to the diode assembly cathode 202 via a metal connection, and the second metal end 32 is electrically connected to the second electrode 42 via a metal connection.

In this embodiment, by virtue of conducting element of the seal ring portion 50 including the resistor 30, ESD protection of the semiconductor device 1 may be improved, the seal ring portion 50 may provide not only physical protection to the device portion 40, but also provide ESD protection, and thereby save space on the semiconductor device 1 by not requiring the addition of a separate anti-ESD structure.

In the semiconductor device 1 in this embodiment, by virtue of the conducting element (Y) of the seal ring portion 50 including the eHEMT 10, the diode assembly 20, and the resistor 30, the eHEMT 10, the diode assembly 20 and the resistor 30 surrounding the device portion 40, the diode assembly cathode 202 being electrically connected to the first metal end 31 of the resistor 30, the second metal end 32 of the resistor 30 being connected to the second electrode 42 of the semiconductor element 412, the first gate electrode 12 of the eHEMT 10 being connected to the diode assembly cathode 202, the first drain electrode 13 of the eHEMT 10 being electrically connected to the second electrode 42 of the semiconductor element 412, and the first source electrode 11 of the eHEMT 10 being electrically connected to the second electrode 42 of the semiconductor element 412, an enclosed ring around the device portion 40 may be formed, is able to physically shield the device portion 40 is able to by physically shielded, and the device portion 40 is prevented from being damaged during dicing due to stress or impurities (e.g., debris generated during dicing). When positive electric charge is accumulated at the first electrode 41 and a positive potential relative to the second electrode 42 is created, the seal ring portion 50 will conduct the accumulated charge away via the operating of the diode assembly 20 and the eHEMT 10 to discharge the built-up charge. Additionally, when negative electric charge is accumulated at the first electrode 41 and a negative potential relative to the second electrode 42 is created, the seal ring portion 50 will conduct the accumulated charge away via the eHEMT 10 and the built-up charge will be discharged. In summary of the above, the conducting element of the seal ring portion 50 can not only physically protect the device portion 40 but also provide ESD protection to the device portion 40, and the semiconductor device 1 according to the disclosure would not require an additional anti-ESD structure which saves space.

In some embodiments, the diode assembly 20 and the resistor 30 are both located along an outer periphery of the eHEMT 10.

In some embodiments, the first electrode 41 serves as a gate electrode of the semiconductor element 412, and the second electrode 42 serves as a source electrode of the semiconductor element 412.

In some other embodiments, the first electrode 41 serves as a source electrode of the semiconductor element 412, and the second electrode 42 serves as a gate electrode of the semiconductor element 412.

In some embodiments where the first electrode 41 serving as the source electrode of the semiconductor element 412, and the second electrode 42 serving as the gate electrode of the semiconductor element 412, the diode assembly anode 201 of the diode assembly 20 is connected to the source electrode of the semiconductor element 412, the first source electrode 11 of the eHEMT 10 is connected to the gate electrode of the semiconductor element 412, the first gate electrode 12 of the eHEMT 10 is connected to the diode assembly cathode 202 of the diode assembly 20, and the first drain electrode 13 of the eHEMT 10 is connected to the source electrode of the semiconductor element 412. In this way, the seal ring portion 50 dissipates electro-static charge built-up in the source electrode of the semiconductor element 412. Because the seal ring portion 50 may discharge electro-static charge built-up in the gate electrode of the semiconductor element 412 in a similar fashion to the way in which the seal ring portion 50 discharges electro-static charge built-up in the source electrode of the semiconductor element 412, further details thereof are omitted for the sake of brevity.

Figure 7:
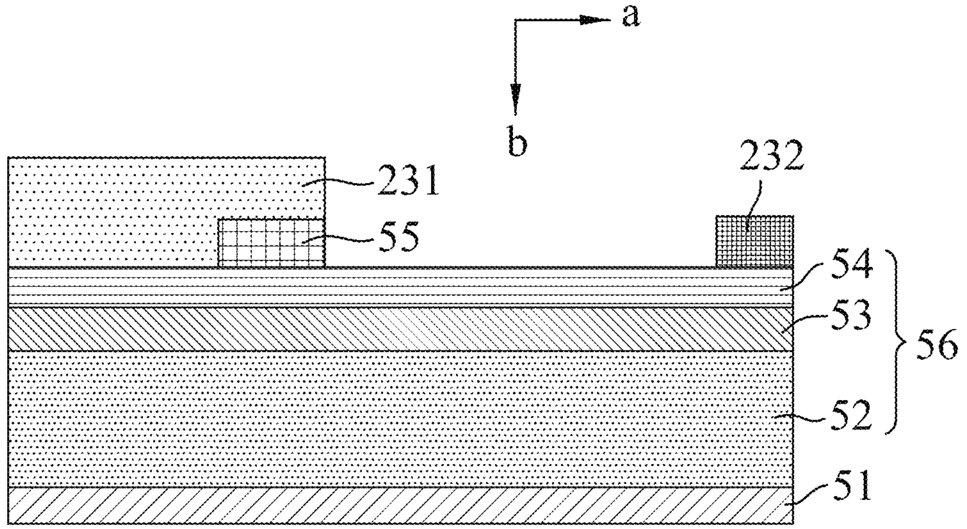
FIG. 7 is a schematic cross-sectional view illustrating a diode of the embodiment.

In some embodiments, each diode 23 has a diode anode 231. The diode anode 231 is formed from the second electrode portion 122 of the first gate electrode 12 and the first electrode portion 112 of the first source electrode 11 of the eHEMT via a metal connection. In some embodiments, the eHEMT 10 has multiple cells, and a single cell of the eHEMT 10 is shown in FIG. 6. It should be noted that in some embodiments, the diode 23 may also have multiple diode cells, and the resistor 30 may also have multiple resistor cells. Referring to FIGS. 6 and 7, in some embodiments, during formation of the diode assembly 20, a single cell of the eHEMT is formed first at a location where the diode assembly 20 is to be formed, then the second electrode portion 122 of the first gate electrode 12 and the first electrode portion 112 of the first source electrode 11 of the structure of the eHEMT in the location where the diode assembly 20 is to be formed is connected via a metal connection so as to form the diode anode 231 of each diode 23.

Figure 8:
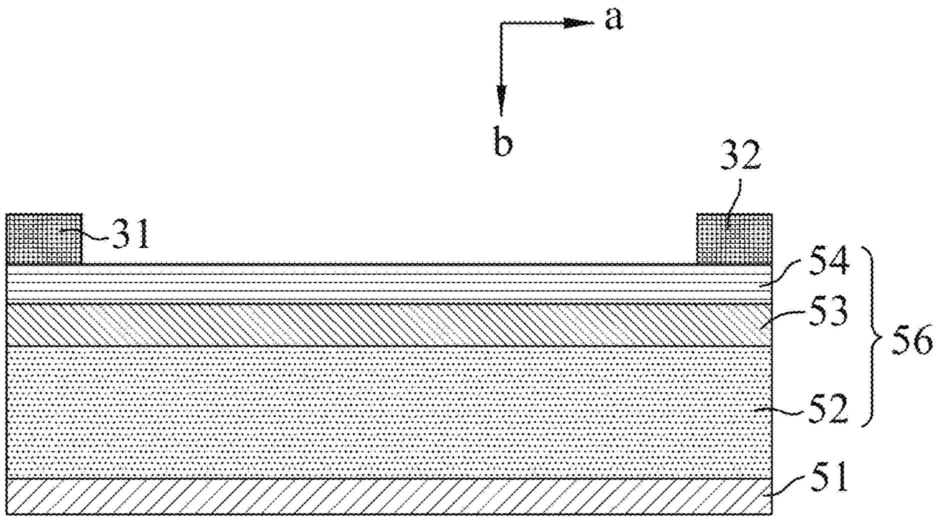
FIG. 8 is a schematic cross-sectional view illustrating a resistor of the embodiment.
Figure 9:
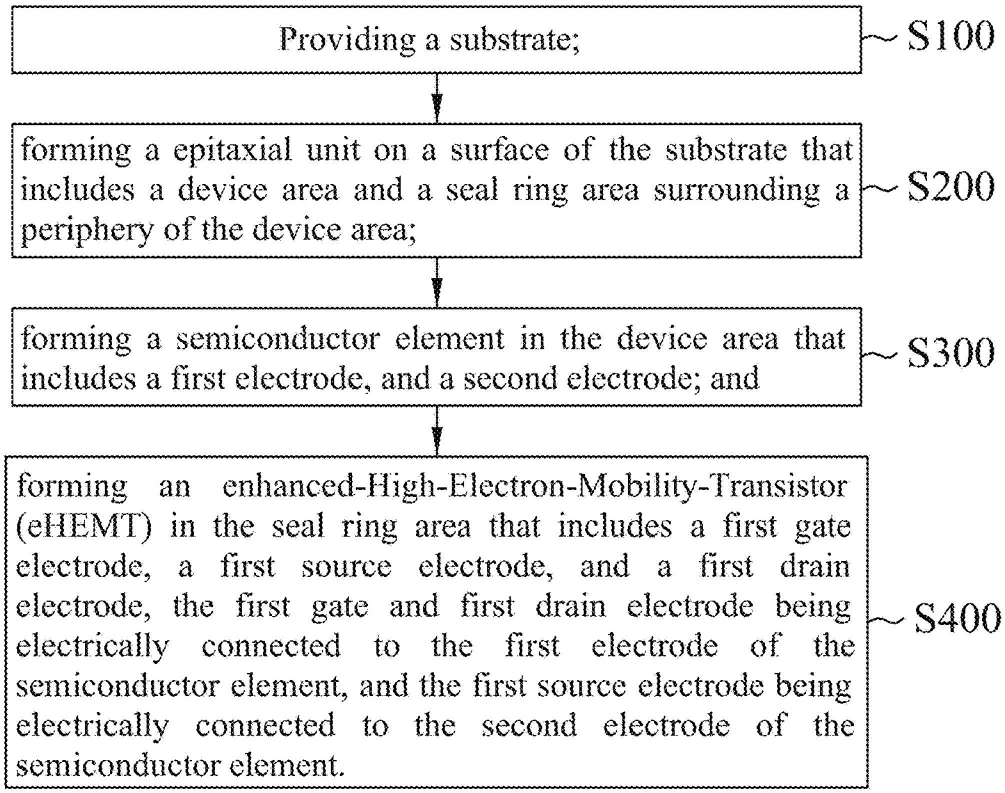
FIG. 9 is a block diagram illustrating an embodiment of a method of making a semiconductor device according to the present disclosure.

Referring to FIGS. 6 to 8, in some embodiments, there is a source-to-gate distance (SG) that ranges from 0.5 μm to 1.5 μm between the first electrode portion 112 of the first source electrode 11 and the second electrode portion 122 of the first gate electrode 12 of said eHEMT 10 along a first direction (a) that is parallel to a direction of arrangement of the first source electrode 11 to the first gate electrode 12 of the eHEMT 10. In some embodiments, the second electrode portion 122 of the first gate electrode 12 has a length along the first direction (a) that ranges from 0.5 μm to 1.0 μm. In some embodiments, there is a gate-to-drain distance (GD) that ranges from 1.5 μm to 3.0 μm between the second electrode portion 122 of the first gate electrode 12 and the third electrode portion 132 of the first drain electrode 13 of the eHEMT 10 along the first direction (a). In some embodiments, the second electrode portion 122 of the first gate electrode 12 has a width along a second direction (b) that ranges from 10000 μm to 20000 μm. The second direction (b) is perpendicular to the first direction (a). In other words, the second direction (b) is opposite to a stacking direction along the substrate 51 towards the epitaxial unit 56 of the semiconductor device 1.

The dimension of each diode 23 along the first direction (a) is in the same range as the dimension of the eHEMT 10. However, in some embodiments, before an anode of each diode 23 is formed, each diode 23 has a gate electrode and a source electrode. The third gate electrode of each diode has a dimension in the second direction (b) that is not in the same range as the first gate electrode 12 of the eHEMT 10. For example, the gate electrode of each diode 23 may have a width in the second direction (b) that may range from 400 μm to 1000 μm.

In some embodiments, the gate electrode and the source electrode of each diode 23 has a distance between them that ranges from 0.5 μm to 1.5 μm along the first direction (a), and the gate electrode of each diode 23 has a length along the first direction (a) that ranges from 0.5 μm to 1.0 μm. In some embodiments, a distance between the diode anode 231 and a diode cathode 232 of each diode 23 along the first direction (a) ranges from 1.5 μm to 3.0 μm.

In some embodiments, a distance between the first metal end 31 and the second metal end 32 of the resistor 30 along the first direction (a) ranges from 3.0 μm to 4.0 μm. In other words, the length of the resistor 30 along the first direction (a) ranges from 3.0 μm to 4.0 μm. The resistor 30 has a width along the second direction (b) that ranges from 2000 μm to 2500 μm, that is, the resistor 30 may have a width that ranges from 2000 μm to 2500 μm.

In some embodiments, the first source electrode 11 and the first drain electrode 13 of the eHEMT 10 are disposed on the barrier layer 54, and the first gate electrode 12 of the eHEMT 10 is disposed on the P-type nitride layer 55.

In some embodiments, diode anodes 231 of the diodes 23 of the diode assembly 20 are disposed on the P-type nitride layer 55, and the diode cathodes 232 of the diodes 23 of the diode assembly 20 are disposed on the barrier layer 54.

In some embodiments, the first metal end 31 and the second metal end 32 of the resistor 30 are disposed on the barrier layer 54.

In some embodiments, the seal ring portion 50 includes an isolation zone 501 located between the eHEMT 10, the diode assembly 20, and the resistor 30. In this way, the eHEMT 10, the diode assembly 20, and the resistor 30 may be isolated from each other via the isolation zone 501.

Referring to FIGS. 1, 2 and 6, a seal ring structure according to the present disclosure surrounds the device portion 40 that includes the semiconductor element 412 including the first electrode 41 and the second electrode 42. The seal ring structure includes the substrate 51, and the seal ring portion 50 of the semiconductor structure that is located on the substrate 51. The seal ring portion 50 surrounds the device area 40, and includes the conducting element that includes the eHEMT 10. The eHEMT 10 includes the first gate electrode 12 adapted for electrical connection to the first electrode 41 of the semiconductor device 412, the first source electrode 11 adapted for electrical connection to the second electrode 42 of the semiconductor device 412, and the first drain electrode 13 adapted for electrical connection to the first electrode 41 of the semiconductor device 412.

Referring to FIGS. 1, 3, 6 and 7, the conducting element further includes a plurality of diodes 23 that form the diode assembly 20 and that are adapted to be electrically connected between the first electrode 41 of the semiconductor device 412 and the first gate electrode 12 of the eHEMT 10. The diode assembly 20 includes the diode assembly anode 201 that is adapted for electrical connection with the first electrode 41, and the diode assembly cathode 202 that is adapted for electrical connection with the first gate electrode 12.

Referring to FIGS. 1, 4 and 8, the conducting element further includes the resistor 30 that is adapted to be electrically connected between the diode assembly cathode 202 and the second electrode 42 of the semiconductor element 412. The resistor 30 includes a first metal end 31 connected to the diode assembly cathode 202, and a second metal end 32 adapted to be connected to the second electrode 42 of the semiconductor element 412.

Referring to FIGS. 1, 2, 6 and 9, an embodiment of a method for making the semiconductor device 1 according to the present disclosure includes the following steps S100 to S400. In the step S100, the substrate 51 is provided. Then, in the step S200, the epitaxial unit 56 is formed on a surface of the substrate 51 and includes a device area and a seal ring area surrounding a periphery of the device portion 40. In the step S300, the semiconductor element 412 is formed in the device area, and includes the first electrode 41, and the second electrode 42. Finally, in the step S400, the enhanced-High-Electron-Mobility-Transistor (eHEMT) 10 is formed in the seal ring area and includes the first gate electrode 12, the first source electrode 11, and the first drain electrode 13. The first gate and first drain electrodes 12, 13 are electrically connected to the first electrode 41 of the semiconductor element 412, and the first source electrode 11 is electrically connected to the second electrode 42 of the semiconductor element 412.

In some embodiments, the epitaxial unit 56 may include the buffer layer 52, the channel layer 53, the barrier layer 54, and the P-type nitride layer 55 sequentially stacked on the substrate 51.

In some embodiments, the barrier layer 54 may be an AlGaN barrier layer, and may have a thickness ranging from 1 nm to 50 nm. The channel layer 53 may be a GaN channel layer 53, the P-type nitride layer may be a P-type GaN layer. The P-type nitride layer 55 may have a thickness that ranges from 50 nm to 300 nm, and a doping concentration ranging from $10^{17}$ to $10^{21}$ $cm^{-3}$.

In some embodiments, in the step S400, when forming the eHEMT 10 in the seal ring portion 50, the P-type nitride layer 55 is etched to define a P-type nitride layer of the eHEMT 10.

In some embodiments, in the step S400, when forming the eHEMT 10 in the seal ring portion 50, the first gate electrode 12 is formed on the etched P-type nitride layer 55, and the first source electrode 11 and the first drain electrode 13 are formed on the barrier layer 54.

It should be noted that the seal ring portion 50 of the disclosure is designed with the intent to protect the device portion 40 from all directions and seal the device portion 40. This may prevent the device portion 40 from being damaged during wafer dicing due to stress or impurities.

Figure 10:
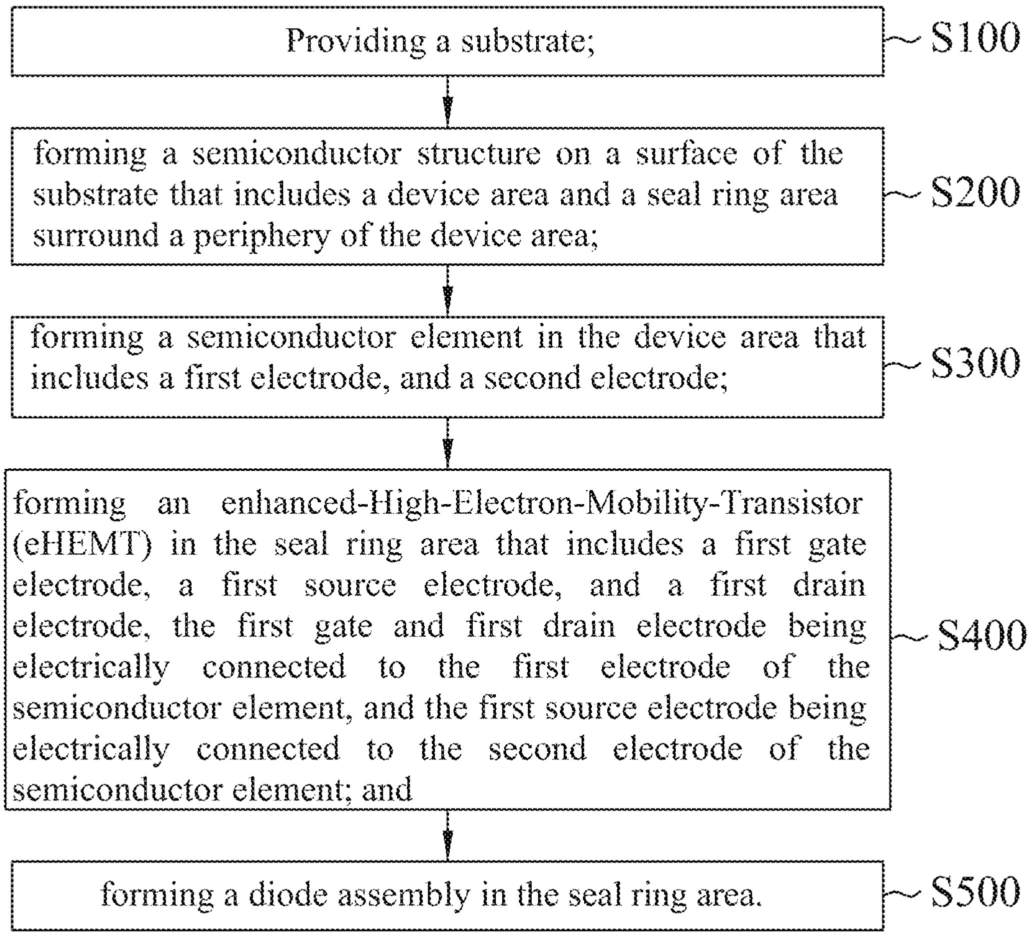
FIG. 10 is a block diagram illustrating another method of making a semiconductor device.
Figure 11:
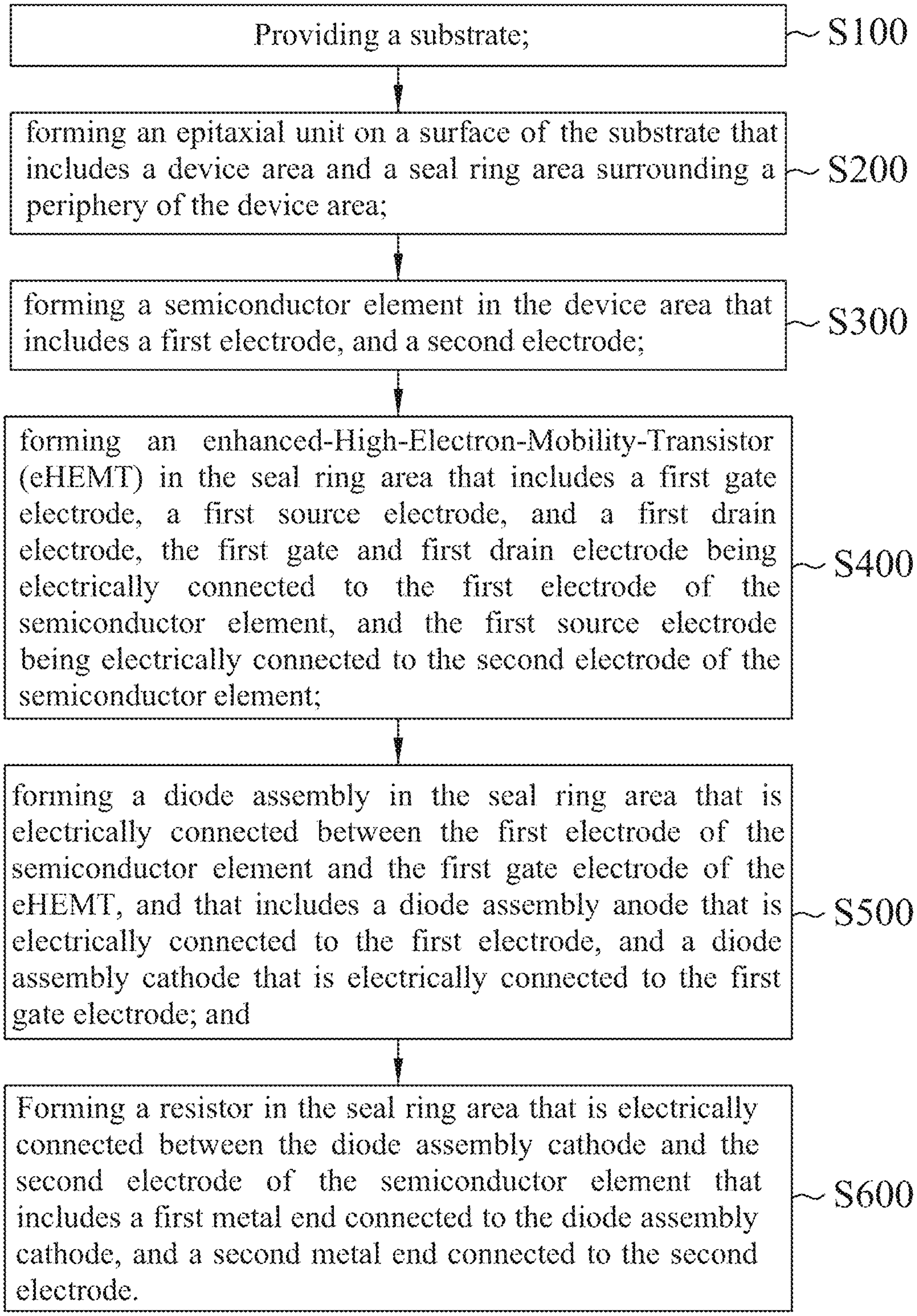
FIG. 11 is a block diagram illustrating yet another method of making a semiconductor device.

In some embodiments, as shown in FIG. 10, the method may further include a Step S500, where the diode assembly 20 is formed in the seal ring area and is electrically connected to the first electrode 41 of the semiconductor element 412 and the first gate electrode 12 of the eHEMT 10. The diode assembly 20 includes the diode assembly anode 201 that is electrically connected to the first electrode 41, and the diode assembly cathode 202 that is electrically connected to the first gate electrode 12.

In some embodiments, in the step S500 of forming the diode assembly 20 in the seal ring area, the P-type nitride layer 55 is etched to define a P-type nitride layer of the diode assembly 20. That is, the P-type nitride layer 55 is etched to define a P-type nitride layer of each of the diodes 23. In some embodiments, the eHEMT 10 has multiple cells, and the P-type nitride layers 55 are etched to define the P-type nitride layers of the diode assembly 20. In other embodiments, etching the P-type nitride layer 55 to define the P-type nitride layer of a single cell of the eHEMT 10 and the P-type nitride layer of the diode assembly 20 may be conducted simultaneously.

In some embodiments, the first source electrode 11 and the first drain electrode 13 of the eHEMT 10, and the diode assembly cathode 202 are formed at the same time. However, in other embodiments, they may be formed at different times, and this is not a limitation of the disclosure.

In some embodiments, the eHEMT may have multiple cells. In some embodiments, in the step S500, the diode anode 231 of each diode 23 in the diode assembly 20 is formed via a metal connection between the second electrode portion 122 of a first gate electrode 12 and the first electrode portion 112 of a first source electrode 11 of a single cell of the eHEMT.

In some embodiments, the method includes a further step S600. In the step S600, the resistor 30 is formed in the seal ring area and is electrically connected to the diode assembly cathode 202 and the second electrode 40 of the semiconductor element 412. The resistor 30 includes the first metal end 31 connected to the diode assembly cathode 202, and the second metal end 32 connected to the second electrode 42.

In some embodiments, in the step S600, the P-type nitride layer 55 located at a position where the resistor is to be formed is removed.

In some embodiments, the eHEMT 10 forms an enclosed ring around the semiconductor element 412 of the device portion 40, and the resistor 30 and the diode assembly 20 are disposed around the outer periphery of the device portion 40. In some embodiments, the diode assembly 20 and the resistor are disposed to surround an outer periphery of the eHEMT 10. In some other embodiments, the diode assembly 20 and the resistor 30 are each disposed between the eHEMT 10 and the device portion 40.

In some embodiments, the P-type nitride layer 55 is etched via Inductively Coupled Plasma-Reactive Ion Etching (ICP-RIE).

In some embodiments, when the resistor 30 is formed in the seal ring area in step S600, the first metal end 31 and the second metal end 32 of the resistor 30 may be formed separately.

Furthermore, it is worth noting that the first source electrode 11 and the first drain electrode 13 of the eHEMT, the diode assembly cathode 202, and the first and second metal ends 31, 32 of the resistor 30 may be either formed separately or at the same time, as long as the eHEMT 10 encloses the device portion 40 in a ring, and the diode assembly 20 and the resistor 30 formed between the eHEMT 10 and the device portion 40.

In some embodiments, the first source and drain electrodes 11, 13 of the eHEMT 10, the diode assembly cathode 202, and the first and second metal ends 31, 32 of the resistor may be formed via deposition or sputtering.

Additionally, the first source and drain electrodes 11, 13 of the eHEMT 10, the diode assembly cathode 202, and the first and second metal ends 31, 32 of the resistor 30 may each be made of a material including a metal such as titanium (Ti), aluminum (Al), nickel (Ni), gold (Au), tantalum (Ta) or any compound or alloy including any one or a number of the above metals.

In some embodiments, each of the eHEMT 10, the diode assembly 20, and the resistor 30 has an active region formed by ion implantation of the epitaxial unit 56. The active regions are isolated from each other. A portion of the epitaxial unit 56 that is not subjected to ion implantation forms an isolation region to isolate the active regions of the eHEMT 10, the diode assembly 20, and the resistor 30.

In some embodiments, the step S500 of forming the diode assembly 20 in the seal ring area further includes forming an individual diode anode 231 for each diode 23 in the diode assembly 20.

In some embodiments, the first gate electrode 12 of the eHEMT 10 and the diode anode 231 of each diode 23 of the diode assembly are formed via deposition or sputtering. Additionally, the first gate electrode 12 may include a metal such as Ti, Ni, palladium (Pd), Au, or any compound or alloy including any one or a number of the above metals.

In order to improve fabrication efficiency and simplify processing the eHEMT 10, the diode assembly 20, and the resistor 30 may be formed at the same time. In some embodiments, the diode assembly 20 is formed on the basis of the eHEMT 10. That is, a plurality of eHEMTs are formed on a region of the seal ring area (referred to as eHEMT region) where the eHEMT 10 is to be formed and a region of the seal ring area (referred to as diode assembly region) where the diode assembly 20 is to be formed, thereby forming the eHEMT in the eHEMT region and the diode assembly region. It should be noted that, the eHEMT 10 and the diode assembly 20 are located on different regions of the seal ring area.

In this way, when the diode assembly 20 is being formed, the first gate electrode 12 and the first source electrode 11 of each of the eHEMTs in the diode assembly region may be connected via a metal connection, thereby forming a diode anode 231 of the diode.

In order to conduct away built-up electro-static charge in the device portion 40, in some embodiments, the method of making the semiconductor device 1 may further include, forming a metal connection between the diode assembly anode 201 and the first electrode 41 of the semiconductor element 412, forming a metal connection between the diode assembly cathode 202 and the first metal end 31 of the resistor 30, forming a metal connection between the second metal end 32 and the second electrode 42 of the semiconductor element 412, forming a metal connection between the first gate electrode 12 of the eHEMT 10 and the diode assembly cathode 202 of the diode assembly 20, forming a metal connection between the first drain electrode 13 of the eHEMT 10 and the first electrode 41, and forming a metal connection between the first source electrode 11 of the eHEMT 10 and the second electrode 42 of the semiconductor element 412.

The above step ensures that the diode assembly 20, the eHEMT 10, and the resistor 30 are interconnected together via the metal connections and forms an electrostatic protection structure, and thereby improve the ESD protection of the semiconductor element 412. The above is a brief overview of the anti-ESD function of the semiconductor device 1, the specific electrical connections and equivalent circuits may be referenced from FIG. 2 and the previous description of the relevant structures and will be omitted hereinafter for the sake of brevity.

Additionally, when metal connections are formed, care should be taken to insulate and isolate electrodes to prevent a short circuit forming between different electrodes. For example, when the metal connection between the diode assembly cathode 202 and the first metal end 31 of the resistor 30 is formed, an insulation layer may be formed on a corresponding area besides the diode assembly cathode 202, and the first metal end 31. Other metal connections may be formed in a similar way, and further details are omitted.

In this disclosure, by virtue of the eHEMT 10, the diode assembly 20, and the resistor 30 being connected via the metal connections and forming the seal ring structure, and then connecting the seal ring structure to the semiconductor element 412 to form the semiconductor device 1, the semiconductor device 1 may have the semiconductor element 412 of the device portion 40 be physically protected as well as have good ESD protection.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A semiconductor device comprising:

a substrate; and a semiconductor structure located on the substrate, and including a device portion that includes a semiconductor element including a first electrode, and a second electrode, and a seal ring portion that surrounds said device portion, and that includes a conducting element, said conducting element including an enhanced-High-Electron-Mobility-Transistor (eHEMT) that includes a gate electrode electrically connected to said first electrode, a source electrode electrically connected to said second electrode, and a drain electrode electrically connected to said first electrode.

2. The semiconductor device as claimed in claim 1, wherein said conducting element further includes a plurality of diodes that form a diode assembly electrically connected to said first electrode of said semiconductor element and said gate electrode of said eHEMT, said diode assembly including a diode assembly anode electrically connected to said first electrode, and a diode assembly cathode electrically connected to said gate electrode.

3. The semiconductor device as claimed in claim 2, wherein at least two of said diodes of said diode assembly are electrically connected in series.

4. The semiconductor device as claimed in claim 2, wherein said conducting element further includes a resistor that is electrically connected between said diode assembly cathode and said second electrode of said semiconductor element, and that includes a first metal end connected to said diode assembly cathode, and a second metal end connected to said second electrode.

5. The semiconductor device as claimed in claim 4, wherein each of said diode assembly and said resistor are disposed between said eHEMT and said semiconductor element.

6. The semiconductor device as claimed in claim 5, wherein first distances between said diodes of said diode assembly and a peripheral edge of said device portion are equal.

7. The semiconductor device as claimed in claim 6, wherein said resistor is a second distance away from said peripheral edge of said device portion, and the second distance is equal to the first distance.

8. The semiconductor device as claimed in claim 7, wherein:

said diode assembly includes a first sub-assembly located on a first side of said device portion, and a second sub-assembly located on a second side of said device portion; and said first side of said device portion is adjacent to said second side of said device portion.

9. The semiconductor device as claimed in claim 8, wherein said first sub-assembly and said second sub-assembly are electrically connected in series, and said first sub-assembly includes said diode assembly anode that is electrically connected to said first electrode, and said second sub-assembly includes said diode assembly cathode that is connected with said first metal end of said resistor.

10. The semiconductor device as claimed in claim 9, wherein said first sub-assembly and said resistor are located on opposite sides of said device portion.

11. The semiconductor device as claimed in claim 1, wherein said eHEMT forms an enclosed ring.

12. The semiconductor device as claimed in claim 1, wherein:

said first electrode serves as a gate electrode of said semiconductor element; and said second electrode serves as a source electrode of said semiconductor element.

13. The semiconductor device as claimed in claim 1, wherein:

said first electrode serves as a source electrode of said semiconductor element; and said second electrode serves as a gate electrode of said semiconductor element.

14. A method for making a semiconductor device comprising providing a substrate;

forming an epitaxial unit on a surface of the substrate that includes a device area and a seal ring area surrounding a periphery of the device area;

forming a semiconductor element in the device area that includes a first electrode, and a second electrode;

forming an enhanced-High-Electron-Mobility-Transistor (eHEMT) in the seal ring area that includes a gate electrode, a source electrode, and a drain electrode, the gate and first drain electrodes being electrically connected to the first electrode of the semiconductor element, and the first source electrode being electrically connected to the second electrode of the semiconductor element.

15. The method as claimed in claim 14, further comprising:

forming a diode assembly in the seal ring area that is electrically connected between the first electrode of the semiconductor element and the first-gate electrode of the eHEMT, and that includes a diode assembly anode that is electrically connected to the first electrode, and a diode assembly cathode that is electrically connected with the first-gate electrode.

16. The method as claimed in claim 15, wherein the diode assembly anode is formed by connecting a source electrode and a gate electrode.

17. The method as claimed in claim 16, further comprising:

forming a resistor in the seal ring area that is electrically connected between the diode assembly cathode and the second electrode of the semiconductor element and that includes a first metal end connected to the diode assembly cathode, and a second metal end connected to the second electrode.

18. A seal ring structure that is adapted to surround a device portion that includes a semiconductor element including a first electrode and a second electrode, said seal ring structure comprising:

a substrate;

a semiconductor structure located on the substrate, and including a seal ring portion that is adapted for surrounding the device portion, and that includes a conducting element formed in the seal ring portion, the conducting element including an enhanced-High-Electron-Mobility-Transistor (eHEMT) that includes:

a gate electrode adapted for electrical connection to said first electrode of the semiconductor element;

a source electrode adapted for electrical connection to the second electrode of the semiconductor element; and a drain electrode adapted for electrical connection to the first electrode of the of the semiconductor element.

19. The seal ring structure as claimed in claim 18, wherein said conducting element further includes:

a plurality of diodes that form a diode assembly adapted to be electrically connected between the first electrode of the semiconductor element and said gate electrode of said eHEMT, said diode assembly includes a diode assembly anode that is adapted for electrical connection with the first electrode, and a diode assembly cathode that is electrically connected to the gate electrode.

20. The seal ring structure as claimed in claim 19, wherein said conducting element further includes a resistor that is adapted to be electrically connected between said diode assembly cathode and the second electrode of the semiconductor element, and that includes:

a first metal end connected to said diode assembly cathode; and a second metal end adapted to be connected to the second electrode of the semiconductor element.

* * * * *